United States Patent
Toyomura

(10) Patent No.: US 9,633,596 B2
(45) Date of Patent: Apr. 25, 2017

(54) DISPLAY UNIT, DISPLAY DRIVING UNIT, DRIVING METHOD, AND ELECTRONIC APPARATUS

(71) Applicant: Joled Inc., Tokyo (JP)

(72) Inventor: Naobumi Toyomura, Tokyo (JP)

(73) Assignee: JOLED Inc., Tokyo (JP)

( * ) Notice: Subject to any disclaimer, the term of this patent is extended or adjusted under 35 U.S.C. 154(b) by 20 days.

(21) Appl. No.: 14/651,031

(22) PCT Filed: Dec. 18, 2013

(86) PCT No.: PCT/JP2013/083963
§ 371 (c)(1),
(2) Date: Jun. 10, 2015

(87) PCT Pub. No.: WO2014/112278
PCT Pub. Date: Jul. 24, 2014

(65) Prior Publication Data
US 2015/0332626 A1 Nov. 19, 2015

(30) Foreign Application Priority Data
Jan. 15, 2013 (JP) ................................ 2013-004542

(51) Int. Cl.
*G09G 3/30* (2006.01)
*G09G 3/3233* (2016.01)
*G09G 3/3266* (2016.01)
*G11C 19/28* (2006.01)
*G09G 3/36* (2006.01)

(52) U.S. Cl.
CPC ............. *G09G 3/30* (2013.01); *G09G 3/3233* (2013.01); *G09G 3/3266* (2013.01); *G11C 19/28* (2013.01); *G09G 3/3674* (2013.01); *G09G 2300/0819* (2013.01); *G09G 2300/0842* (2013.01); *G09G 2300/0866* (2013.01); *G09G 2310/0286* (2013.01); *G09G 2310/0291* (2013.01); *G09G 2330/028* (2013.01)

(58) Field of Classification Search
None
See application file for complete search history.

(56) References Cited

U.S. PATENT DOCUMENTS

| 5,903,248 A * | 5/1999 | Irwin .................. G09G 3/3659 345/211 |
| 2009/0141204 A1* | 6/2009 | Numao ................ G09G 3/3233 349/39 |

FOREIGN PATENT DOCUMENTS

JP 2008-058853 3/2008

* cited by examiner

*Primary Examiner* — Nicholas Lee
(74) *Attorney, Agent, or Firm* — Michael Best & Friedrich LLP

(57) ABSTRACT

It is an object of the disclosure to generate a driving signal having large amplitude at the time of driving pixels, and there is provided a display unit, a display driving unit, a driving method, or an electronic apparatus that includes: a first transistor (Tr2) including a gate, a drain, and a source; a first capacitor (C2) including a first terminal and a second terminal that is connected to one of the drain and the source of the first transistor; and a unit pixel configured to be driven based on a voltage of the second terminal.

13 Claims, 12 Drawing Sheets

DISPLAY UNIT, DISPLAY DRIVING UNIT, DRIVING METHOD, AND ELECTRONIC APPARATUS

TECHNICAL FIELD

The present disclosure relates to a display unit having a current-driving display element, to a display driving unit and a driving method used in such a display unit, and to an electronic apparatus including such a display unit.

BACKGROUND ART

In recent years, in a field of display units performing image display, a display unit (an organic electro luminescence (EL) display unit) using, as a light emitting element, a current-driving optical element whose light emission luminance is varied in response to a value of a flowing current, for example, an organic EL element, has been developed and commercialization thereof is progressing. Unlike a liquid crystal element or the like, the light emitting element is a self light-emitting element, and a light source (a backlight) is unnecessary. Therefore, the organic EL display unit has characteristics of high visibility of an image, low power consumption, high response speed of an element, etc., as compared with a liquid crystal display unit demanding a light source.

In the display unit, drive circuits control pixels arranged in a matrix. For example, in PTL 1, a display panel including a shift register and a drive scanner that includes inverters connected to respective output terminals of the shift register is disclosed.

CITATION LIST

Patent Literature

PTL 1: Japanese Unexamined Patent Application Publication No. 2008-58853

SUMMARY OF INVENTION

Incidentally, at the time of driving pixels, the driving signal therefor often desirably have large amplitude. Therefore, the drive circuit desirably generates such a driving signal having large amplitude.

Therefore, it is desirable to provide a display unit, a display driving unit, a driving method, and an electronic apparatus that are each adapted to generate a driving signal having large amplitude.

A display unit according to an embodiment of the disclosure includes: a first transistor, a first capacitor, and a unit pixel. The first transistor includes a gate, a drain, and a source. The first capacitor includes a first terminal and a second terminal that is connected to one of the drain and the source of the first transistor. The unit pixel is configured to be driven based on a voltage of the second terminal.

A display driving unit according to an embodiment of the disclosure includes a first transistor and a first capacitor. The first transistor includes a gate, a drain, and a source. The first capacitor includes a first terminal and a second terminal that is connected to one of the drain and the source of the first transistor.

A driving method according to an embodiment of the disclosure includes: applying a pulse signal to one of a drain and a source of a first transistor; applying other pulse signal to a first terminal of a first capacitor, the first capacitor including the first terminal and a second terminal that is connected to a terminal different from a terminal supplied with the pulse signal, out of the drain and the source of the first transistor; and driving a unit pixel based on a voltage of the second terminal.

An electronic apparatus according to an embodiment of the disclosure includes the above-described display unit, and examples of the electronic apparatus may include a television apparatus, a digital camera, a personal computer, a video camera, and a mobile terminal device such as a mobile phone.

According to the display unit, the display driving unit, the driving method, and the electronic apparatus according to the respective embodiments of the disclosure, the second terminal of the first capacitor is connected to one of the drain and the source of the first transistor, and the unit pixel is driven based on the voltage of the second terminal. At this time, the pulse signal is applied to a terminal that is different from a terminal connected with the first capacitor out of the drain and the source of the first transistor, and the other pulse signal is applied to the first terminal of the first capacitor.

According to the display unit, the display driving unit, the driving method, and the electronic apparatus according to the respective embodiments of the disclosure, the first transistor and the first capacitor that is connected to one of the drain and the source of the first transistor are provided. Therefore, it is possible to generate a driving signal having large amplitude.

DESCRIPTION OF EMBODIMENTS

Embodiments of the disclosure will be described in detail below with reference to drawings. Note that description thereof will be given in the following order.
1. Embodiment
2. Application examples

1. Embodiment

Configuration Example

Figure 1:
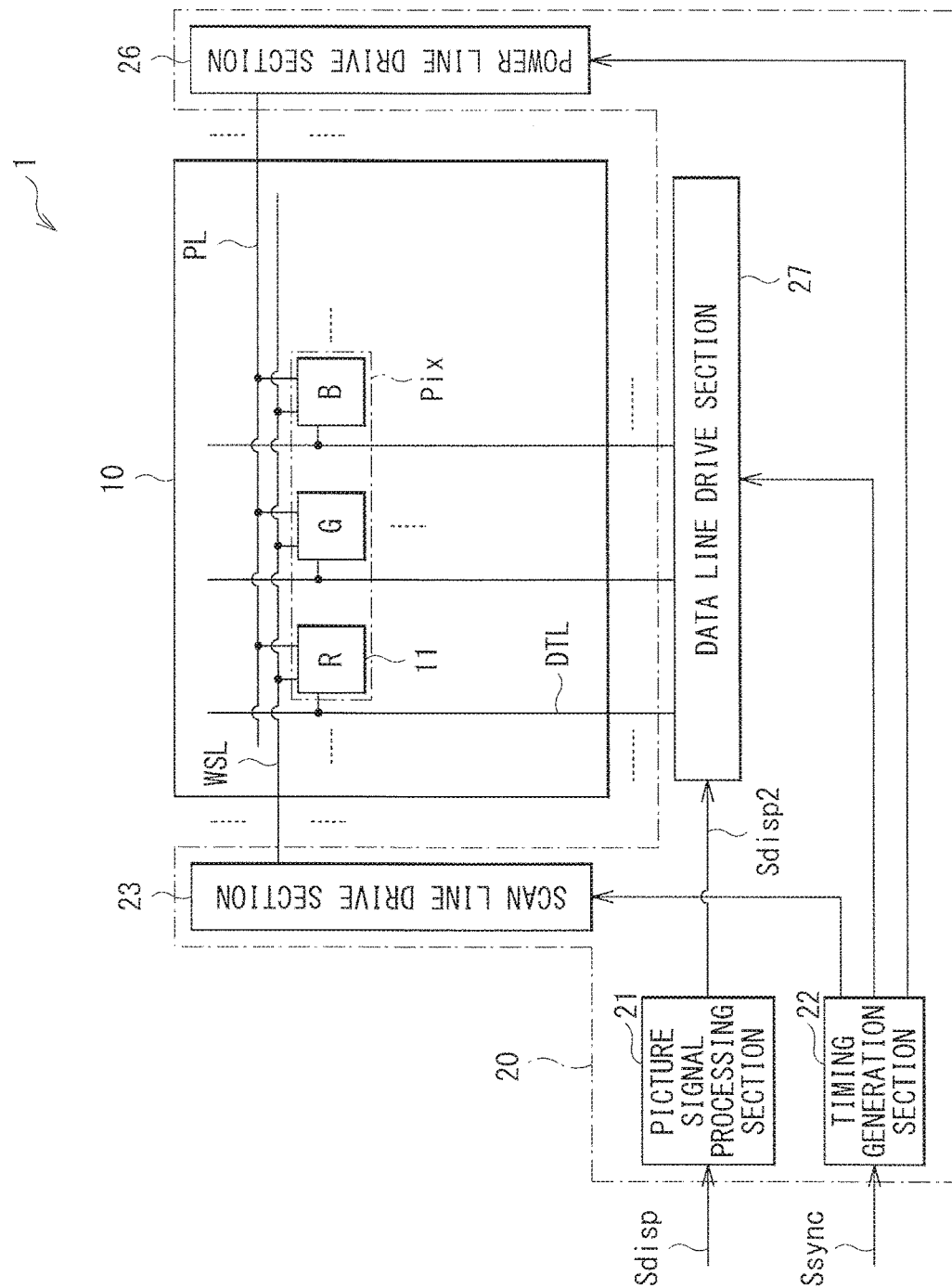
FIG. 1 is a block diagram illustrating a configuration example of a display unit according to an embodiment of the disclosure.

FIG. 1 illustrates a configuration example of a display unit according to an embodiment. A display unit 1 is an active matrix display unit using an organic EL element. Note that a drive unit, a driving method according to respective embodiments of the disclosure are implemented by the present embodiment, and thus will be described together. The display unit 1 includes a display section 10 and a drive section 20.

The display section 10 is configured of a plurality of pixels Pix arranged in a matrix. Each of the pixels Pix includes red, green, and blue sub-pixels 11. The display section 10 includes a plurality of scan lines WSL and a plurality of power lines PL that extend in a row direction, and a plurality of data lines DTL that extend in a column direction. An end of each of the scan lines WSL, the power lines PL, and the data lines DTL is connected to the drive section 20. Each of the above-described sub-pixels 11 is disposed at an intersection of each of the scan lines WSL and each of the data lines DTL.

Figure 2:
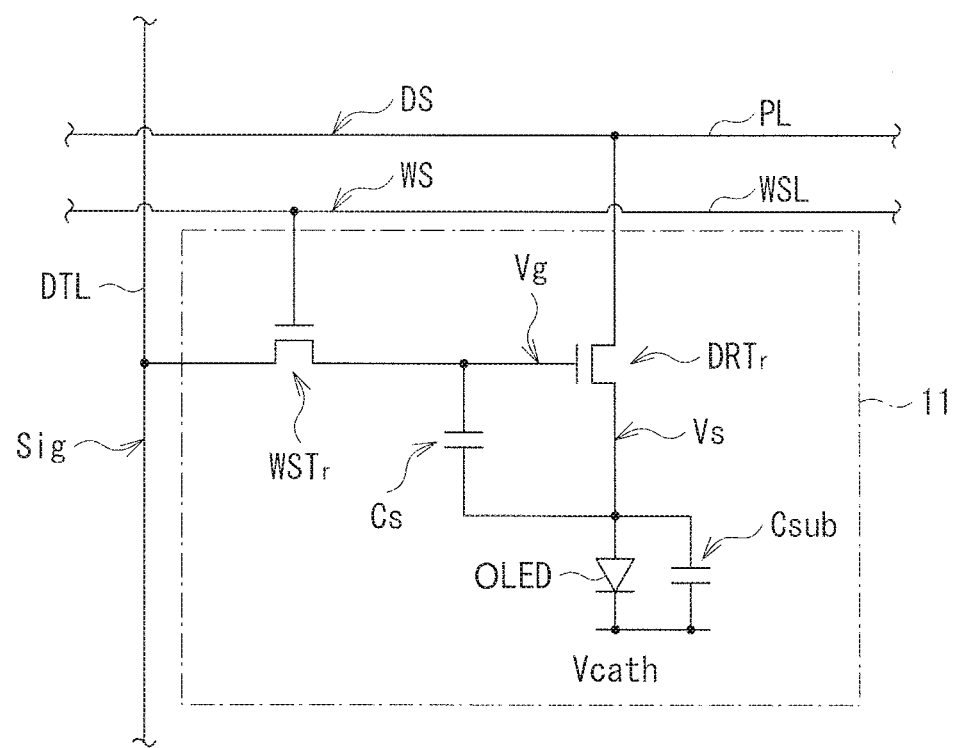
FIG. 2 is a circuit diagram illustrating a configuration example of a sub-pixel illustrated in FIG. 1.

FIG. 2 illustrates an example of a circuit configuration of the sub-pixel 11. The sub-pixel 11 includes a write transistor WSTr, a drive transistor DRTr, an organic EL element OLED, and capacitors Cs and Csub. In other words, in this example, the sub-pixel 11 has a so-called "2Tr2C" configuration that is configured of the two transistors (the write transistor WSTr and the drive transistor DRTr) and the two capacitors Cs and Csub.

Each of the write transistor WSTr and the drive transistor DRTr may be configured of, for example, an N-channel metal oxide semiconductor (MOS) thin film transistor (TFT). A gate of the write transistor WSTr is connected to the scan line WSL, a source thereof is connected to the data line DTL, and a drain thereof is connected to a gate of the drive transistor DRTr and one end of the capacitor Cs. The gate of the drive transistor DRTr is connected to the drain of the write transistor WSTr and the one end of the capacitor Cs, a drain thereof is connected to the power line PL, and a source thereof is connected to the other end of the capacitor Cs and an anode of the organic EL element OLED, and the like.

The one end of the capacitor Cs is connected to the gate of the drive transistor DRTr and the like, and the other end thereof is connected to the source of the drive transistor DRTr and the like. One end of the capacitor Csub is connected to the anode of the organic EL element OLED, and the other end thereof is connected to a cathode of the organic EL element OLED. In other words, in this example, the capacitor Csub is connected in parallel to the organic EL element OLED. The organic EL element OLED is a light emitting element emitting light of color (red, green, or blue) corresponding to each of the sub-pixels 11, and the anode thereof is connected to the source of the drive transistor DRTr and the like, and the cathode thereof is supplied with a cathode voltage Vcath by the drive section 20.

The drive section 20 drives the display section 10 based on a picture signal Sdisp and a synchronization signal Ssync that are supplied from outside. The drive section 20 includes a picture signal processing section 21, a timing generation section 22, a scan line drive section 23, a power line drive section 26, and a data line drive section 27, as illustrated in FIG. 1.

The picture signal processing section 21 performs predetermined signal processing on the picture signal Sdisp supplied from the outside to generate a picture signal Sdisp2. Examples of the predetermined signal processing may include gamma correction and overdrive correction.

The timing generation section 22 is a circuit that supplies a control signal to each of the scan line drive section 23, the power line drive section 26, and the data line drive section 27, based on the synchronization signal Ssync supplied from the outside, and controls these sections to operate in synchronization with one another.

The scan line drive section 23 sequentially applies a scan signal WS to the plurality of scan lines WSL according to the control signal supplied from the timing generation section 22, to sequentially select the sub-pixels 11 on the row basis.

The power line drive section 26 sequentially applies a power signal DS to the plurality of power lines PL according to the control signal supplied from the timing generation section 22, to control light emission operation and light extinction operation of the sub-pixels 11 on the row basis. The power signal DS transits between a voltage Vccp and a voltage Vini. As will be described later, the voltage Vini is a voltage to initialize the sub-pixels 11, and the voltage Vccp is a voltage to allow the current Ids to flow through the drive transistor DRTr to allow the organic EL element OLED to emit light.

Figure 3:
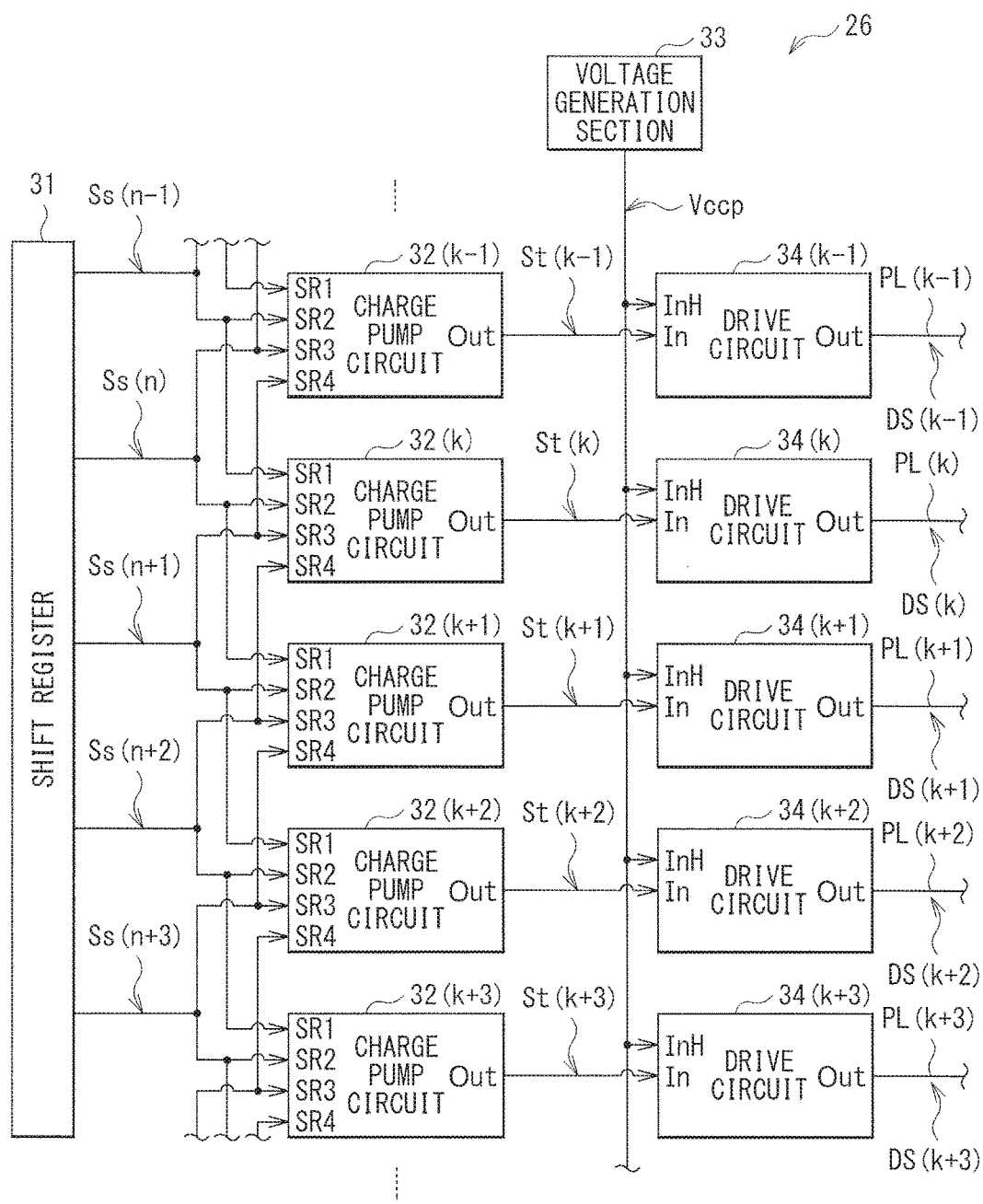
FIG. 3 is a block diagram illustrating a configuration example of a power line drive section illustrated in FIG. 1.

FIG. 3 illustrates a configuration example of the power line drive section 26. The power line drive section 26 includes a shift register 31, a plurality of charge pump circuits 32, a voltage generation section 33, and a plurality of drive circuits 34.

The shift register 31 generates a plurality of scan signals Ss ( . . . , Ss(n−1), Ss(n), Ss(n+1), Ss(n+2), Ss(n+3), . . . ) that are used to select a pixel line to be driven, based on the control signal (not illustrated) supplied from the timing generation section 22. Each of the scan signals Ss is supplied to four charge pump circuits 32. Specifically, for example, the scan signal Ss(n+1) may be supplied to four charge pump circuits 32(k−1), 32(k), 32(k+1), and 32(k+2). Each of the scan signals Ss is a signal transiting between a high level voltage VH and a low level voltage VL. The high level voltage VH is a voltage lower than the voltage Vccp, and the low level voltage VL is a voltage equivalent to the voltage Vini.

Each of the charge pump circuits 32 generates a signal St that has amplitude larger than amplitude of each of four scan signals Ss, based on the four scan signals Ss. Specifically, for example, the charge pump circuit 32(k) generates a signal St(k), based on four scan signals Ss(n−1), Ss(n), Ss(n+1), and Ss(n+2). Each of the charge pump circuits 32 has input terminals SR1 to SR4 to which four scan signals Ss are input, and an output terminal Out outputting the signal St. For example, the scan signal Ss(n−1) may be input to the input terminal SR1 of the charge pump circuit 32(k), the scan signal Ss(n) may be input to the input terminal SR2, the scan signal Ss(n+1) may be input to the input terminal SR3, and the scan signal Ss(n+2) may be input to the input terminal SR4. Each of the charge pump circuit 32 is provided corresponding to each pixel line in the display section 10.

Specifically, for example, k-th charge pump circuit 32(k) is provided corresponding to k-th pixel line.

The voltage generation section 33 generates the voltage Vccp, and supplies the voltage Vccp to each of the drive circuits 34.

Each of the drive circuits 34 generates the power signal DS based on the voltage Vccp supplied from the voltage generation section 33 and the signal St supplied from the charge pump circuit 32. Each of the drive circuits 34 has an input terminal InH supplied with the voltage Vccp, an input terminal In supplied with the signal St, and an output terminal Out outputting the power signal DS. Each of the drive circuits 34 is provided corresponding to each pixel line in the display section 10. Specifically, for example, k-th drive circuit 34(k) may generate k-th power signal DS(k) based on the voltage Vccp supplied from the voltage generation section 33 and the signal St(k) supplied from the charge pump circuit 32(k). Then, the drive circuit 34(k) applies the power signal DS(k) to the power line PL(k) in the k-th pixel line.

Figure 4:
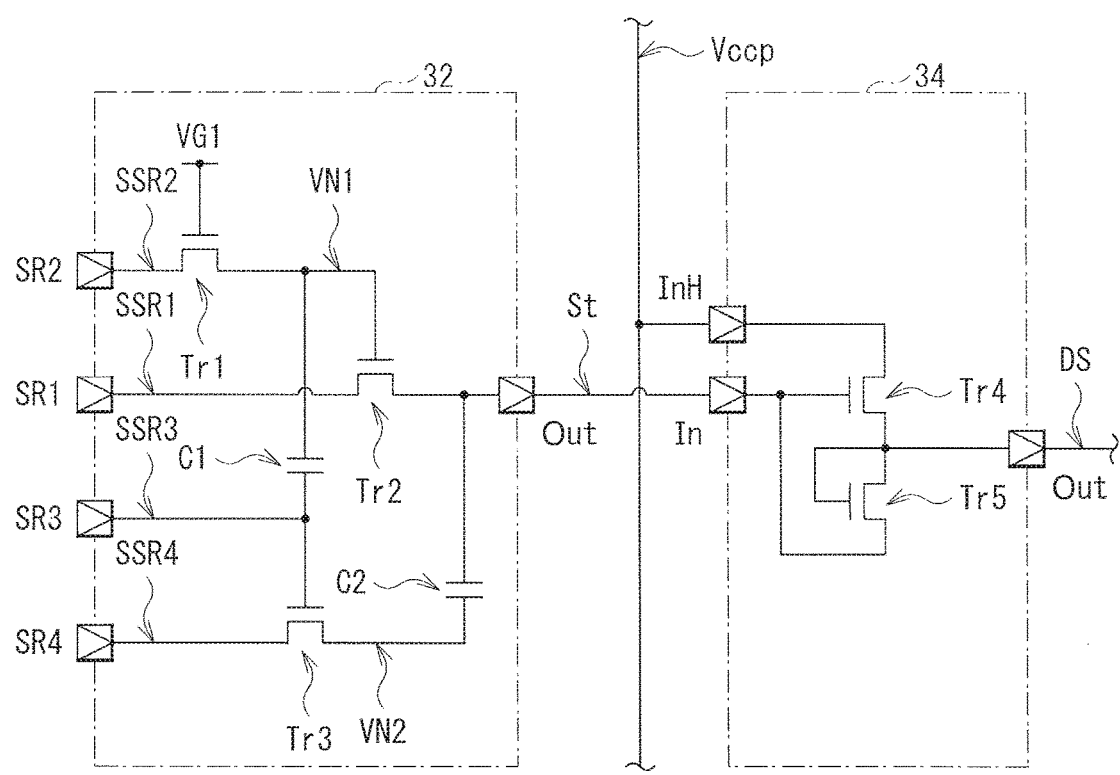
FIG. 4 is a circuit diagram illustrating a configuration example of a charge pump circuit and a drive circuit illustrated in FIG. 3.

FIG. 4 illustrates a configuration example of the charge pump circuit 32 and the drive circuit 34. The charge pump circuit 32 includes transistors Tr1 to Tr3 and capacitors C1 and C2. The drive circuit 34 includes transistors Tr4 and Tr5. Each of the transistors Tr1 to Tr5 may be configured of, for example, an N-channel MOSTFT.

In the charge pump circuit 32, a gate of the transistor Tr1 is supplied with a DC voltage VG1, a drain thereof is connected to the input terminal SR2, and a source thereof is connected to one end of the capacitor C1 and a gate of the transistor Tr2. The voltage VG1 is higher than the low level voltage VL and lower than the high level voltage VH (VH>VG1>VL). The gate of the transistor Tr2 is connected to the source of the transistor Tr1 and the one end of the capacitor C1, a drain thereof is connected to the input terminal SR1, and a source thereof is connected to one end of the capacitor C2 and the output terminal Out of the charge pump circuit 32. A gate of the transistor Tr3 is connected to the other end of the capacitor C1 and the input terminal SR3, a drain thereof is connected to the input terminal SR4, and a source thereof is connected to the other end of the capacitor C2. Note that, in each of the transistors Tr1 to Tr3, the drain and the source may be interchanged with each other. The one end of the capacitor C1 is connected to the source of the transistor Tr1 and the gate of the transistor Tr2, and the other end thereof is connected to the gate of the transistor Tr3 and the input terminal SR3. The one end of the capacitor C2 is connected to the source of the transistor Tr2 and the output terminal Out of the charge pump circuit 32, and the other end thereof is connected to the source of the transistor Tr3.

In each of the drive circuit 34, a gate of the transistor Tr4 is connected to a source of the transistor Tr5 and the input terminal In, a drain thereof is connected to the input terminal InH, and a source thereof is connected to a gate and a drain of the transistor Tr5 and the output terminal Out of the drive circuit 34. The gate of the transistor Tr5 is connected to the drain of the transistor Tr5, the source of the transistor Tr4, and the output terminal Out of the drive circuit 34, and the source thereof is connected to the gate of the transistor Tr4 and the input terminal In.

With this configuration, the charge pump circuit 32 and the drive circuit 34 generate the power signal DS having amplitude (Vccp−Vini) larger than amplitude (VH−VL) of the scan signal Ss, as will be described later.

Figure 5:
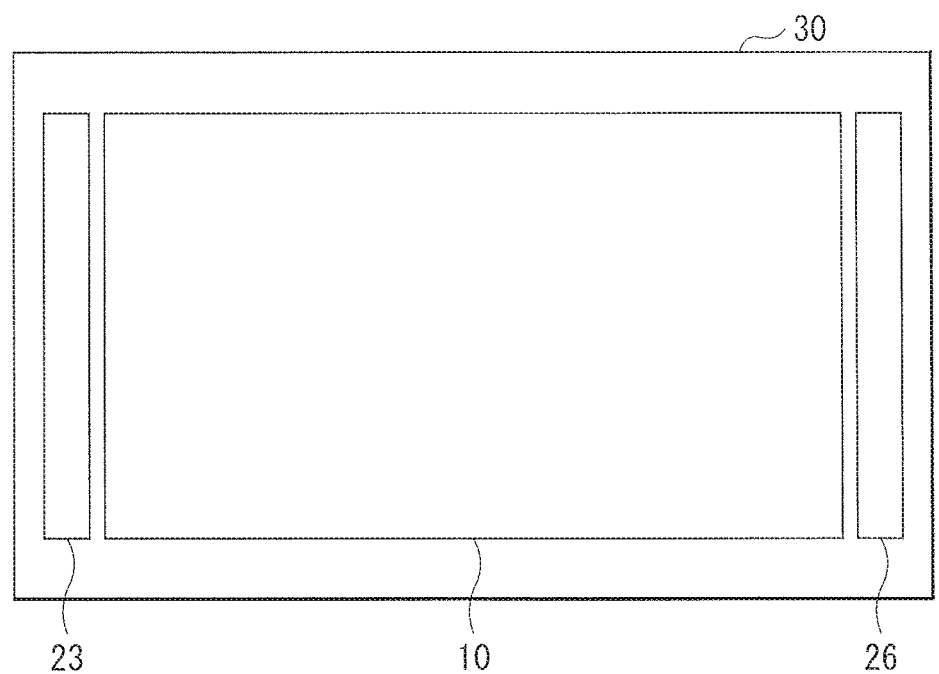
FIG. 5 is an explanatory diagram illustrating an arrangement of the power line drive section in the display unit.

FIG. 5 illustrates arrangement of each block in the display unit 1. In this example, the scan line drive section 23 is disposed in a bezel region on left side of a region provided with the display section 10 of the substrate 30, and the power line drive section 26 is disposed in a bezel region on right side thereof. In other words, the power line drive section 26 is formed on the substrate 30, similar to the display section 10 and the scan line drive section 23.

In FIG. 1, the data line drive section 27 generates a signal Sig including a pixel voltage Vsig that instructs emission luminance of each sub-pixel 11 and a voltage Vofs that is used to perform Vth correction described later, according to the picture signal Sdisp2 supplied from the picture signal processing section 21 and the control signal supplied from the timing generation section 22, and applies the signal Sig to each of the data lines DTL.

With this configuration, as will be described later, the drive section 20 performs correction (the Vth correction) to suppress influence of the element variation of the drive transistor DRTr to the image quality, on the sub-pixels 11. After that, the drive section 20 performs writing of the pixel voltage Vsig on the sub-pixels 11 and performs μ (mobility) correction different from the above-described Vth correction. Then, thereafter, the organic EL element OLED of each of the sub-pixels 11 emits light with luminance corresponding to the written pixel voltage Vsig.

Here, the transistor Tr2 corresponds to a specific but non-limiting example of "first transistor" in the disclosure. The transistor Tr1 corresponds to a specific but non-limiting example of "second transistor" in the disclosure. The transistor Tr3 corresponds to a specific but non-limiting example of "third transistor" in the disclosure. The capacitor C2 corresponds to a specific but non-limiting example of "first capacitor" in the disclosure. The capacitor C1 corresponds to a specific but non-limiting example of "second capacitor" in the disclosure. The transistor Tr4 corresponds to a specific but non-limiting example of "switch" in the disclosure. The transistor Tr5 corresponds to a specific but non-limiting example of "non-linear element" in the disclosure. The sub-pixel 11 corresponds to a specific but non-limiting example of "unit pixel" in the disclosure.

(Operation and Function)

Subsequently, operation and function of the display unit 1 according to the present embodiment is described.

(General Operation Outline)

First, with reference to FIG. 1, general operation outline of the display unit 1 is described. The picture signal processing section 21 performs predetermined signal processing on the picture signal Sdisp supplied from the outside to generate the picture signal Sdisp2. The timing generation section 22 supplies the control signal to each of the scan line drive section 23, the power line drive section 26, and the data line drive section 27, based on the synchronization signal Ssync supplied from the outside, to control these sections to operate in synchronization with one another. The scan line drive section 23 sequentially applies the scan signal WS to each of the plurality of scan lines WSL according to the control signal supplied from the timing generation section 22 to sequentially select the sub-pixels 11 on the row basis. The power line drive section 26 sequentially applies the power signal DS to each of the plurality of power lines PL according to the control signal supplied from the timing generation section 22, to control light emission operation and light extinction operation of the sub-pixels 11 on the row basis. The data line drive section 27 generates the signal Sig including the pixel voltage Vsig that instructs emission luminance of each of the sub-pixels 11 and the voltage Vofs that is used to perform the Vth correction, according to the picture signal Sdisp2 supplied from the picture signal processing section 21 and the control signal supplied from the timing generation section 22, and applies the signal Sig to each of the data lines DTL. The display section 10 performs display based on the scan signal WS, the power signal DS, and the signal Sig that are supplied from the drive section 20.

(Detailed Operation)

Figure 6:
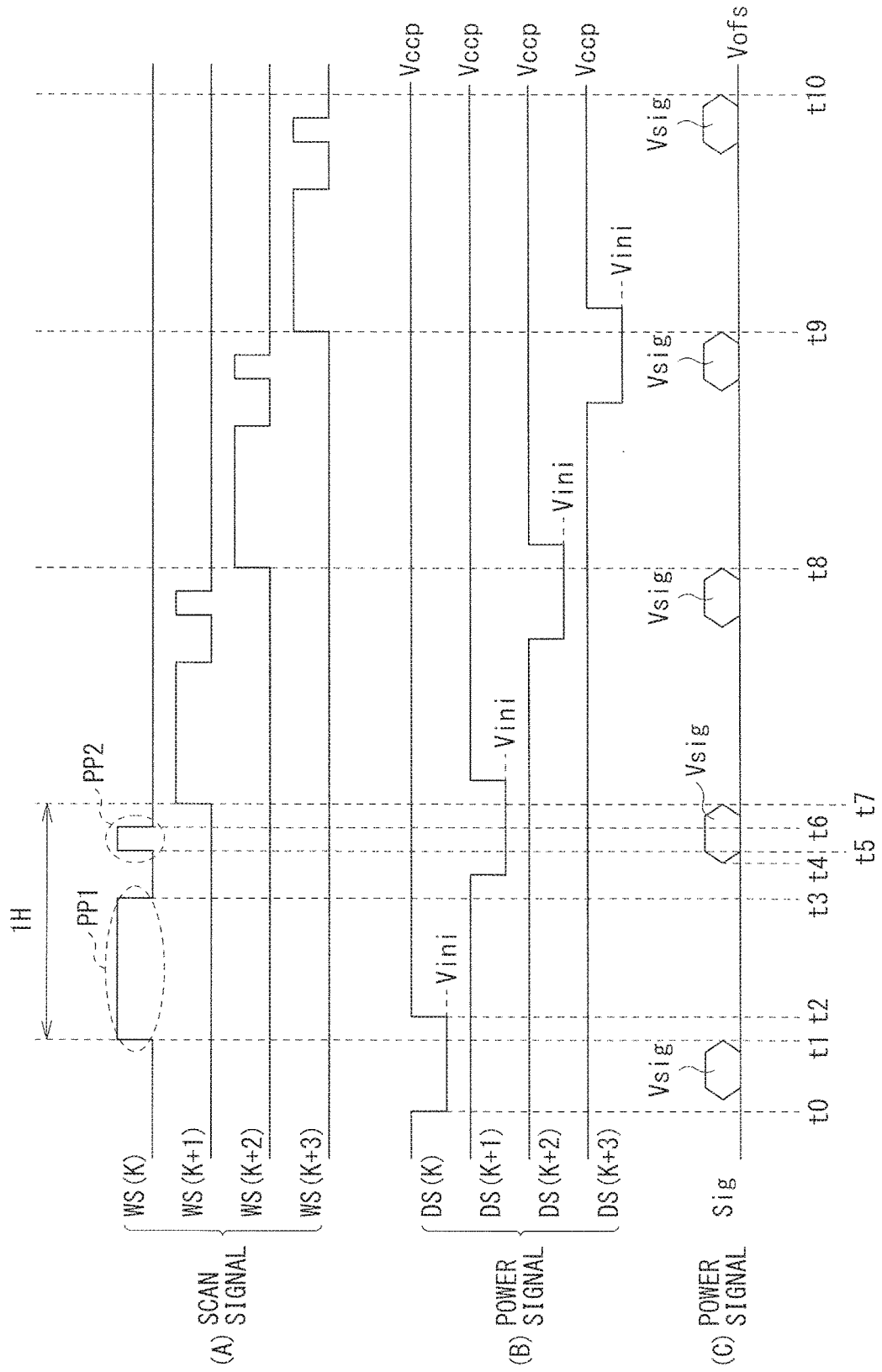
FIG. 6 is a timing waveform chart illustrating an operation example of a drive section illustrated in FIG. 1.

FIG. 6 is a timing chart of the operation of the drive section 20, where (A) illustrates a waveform of the scan signal WS, (B) illustrates a waveform of the power signal DS, and (C) illustrates a waveform of the signal Sig. In (A) of FIG. 6, the scan signal WS(k) indicates the scan signal WS driving the sub-pixels 11 in the k-th line. Likewise, the scan signals WS(k+1), WS(k+2), and WS(K+3) indicates the scan signals WS driving the sub-pixels 11 in (k+1)-th line, (k+2)-th line, and (k+3)-th line, respectively. The same applies to the power signal DS ((B) of FIG. 6).

The scan line drive section 23 of the drive section 20 sequentially applies the scan signal WS having two pulses PP1 and PP2 to each of the scan lines WSL ((A) of FIG. 6). At this time, the scan line drive section 23 applies the two pulses PP1 and PP2 to one scan line WSL during one horizontal period (1H). The power line drive section 26 applies the power signal DS that becomes the voltage Vini only during a predetermined period (for example, a period from timing t0 to timing t2) including start timing (for example, timing t1) of the pulse PP1 and becomes the voltage Vccp during other periods, to each of the power lines PL ((B) of FIG. 6). The data line drive section 27 applies the pixel voltage Vsig to each of the data lines DTL during a predetermined period including the pulse PP2 (for example, a period from timing t4 to timing t7), and applies the voltage Vofs to each of the data lines DTL during other periods ((C) of FIG. 6).

In this way, the drive section 20 drives the sub-pixels 11 in the k-th line during one horizontal period (for example, from timing t1 to timing t7), and drives the sub-pixels 11 in the (k+1)-th line during next horizontal period (for example, from timing t7 to timing t8). Then, drive section 20 drives all of the sub-pixels 11 of the display section 10 during one frame period.

Figure 7:
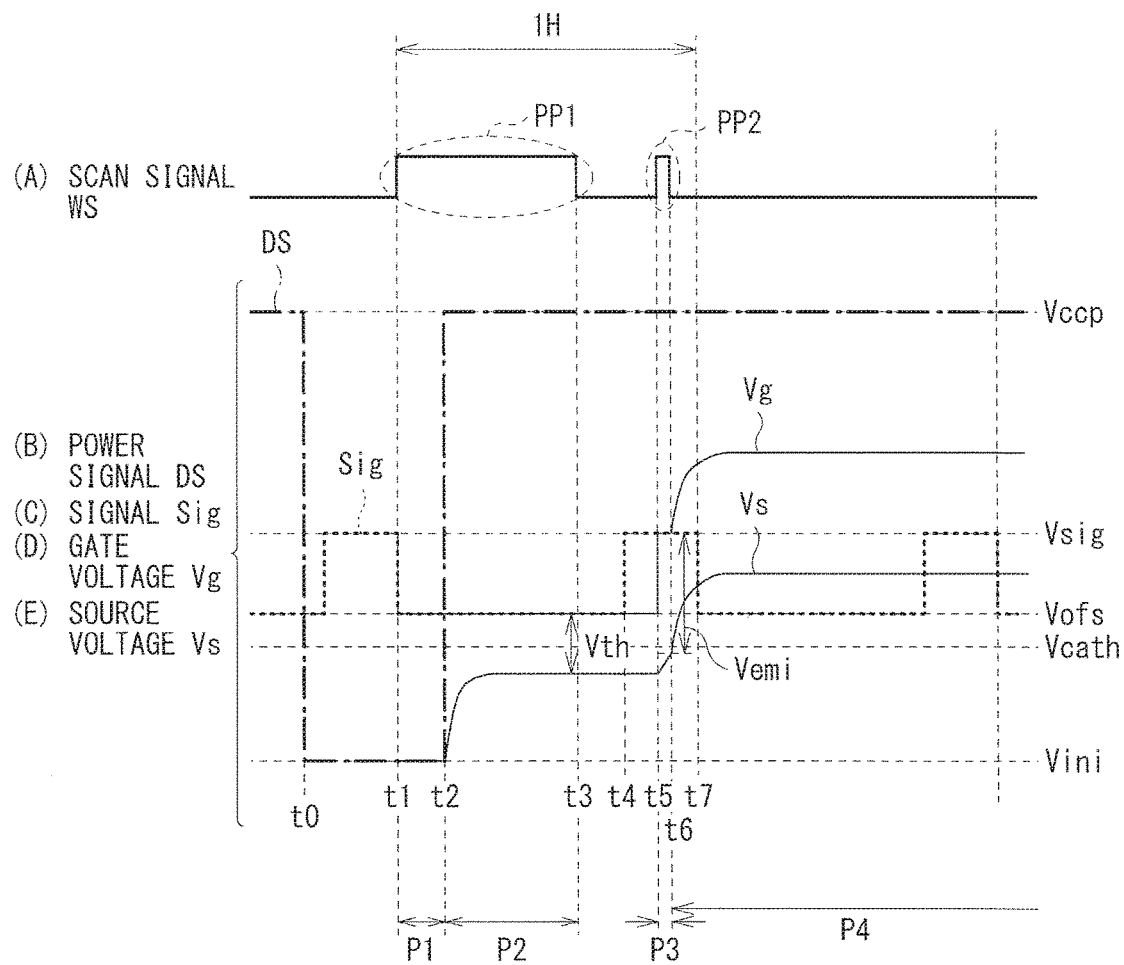
FIG. 7 is a timing waveform chart illustrating an operation example of the sub-pixel illustrated in FIG. 1.

FIG. 7 is a timing chart of the operation of the sub-pixel 11 during the period from the timing t0 to the timing t7, where (A) illustrates a waveform of the scan signal WS, (B) illustrates a waveform of the power signal DS, (C) illustrates a waveform of the signal Sig, (D) illustrates a waveform of the gate voltage Vg of the drive transistor DRTr, and (E) illustrates a waveform of the source voltage Vs of the drive transistor DRTr. In (B) to (E) of FIG. 7, each waveform is illustrated with use of the same voltage axis.

The drive section 20 performs initialization of the sub-pixels 11 (initialization period P1), performs the Vth correction to suppress influence of the element variation of the drive transistor DRTr to the image quality (Vth correction period P2), and performs writing of the pixel voltage Vsig to the sub-pixels 11 and the μ correction (writing and μ correction period P3) during one horizontal period (1H). Then, thereafter, the organic EL element OLED of each of the sub-pixels 11 emits light with luminance corresponding to the written pixel voltage Vsig (emission period P4). The detail thereof is described below.

First, the power line drive section 26 varies the power signal DS from the voltage Vccp to the voltage Vini at timing t0 prior to the initialization period P1 ((B) of FIG. 7). Accordingly, the drive transistor DRTr is turned on, and the source voltage Vs of the drive transistor DRTr is set to the voltage Vini ((E) of FIG. 7).

Next, the drive section 20 initializes the sub-pixels 11 during the period from the timing t1 to the timing t2 (initialization period P1). Specifically, at the timing t1, the data line drive section 27 sets the signal Sig to the voltage Vofs ((C) of FIG. 7), and the scan line drive section 23 varies the voltage of the scan signal WS from the low level to the high level ((A) of FIG. 7). As a result, the write transistor WSTr is turned on, and the gate voltage Vg of the drive transistor DRTr is set to the voltage Vofs ((D) of FIG. 7). In this way, the gate-source voltage Vgs (=Vofs-Vini) of the drive transistor DRTr is set to a voltage larger than the threshold voltage Vth of the drive transistor DRTr, which initializes the sub-pixels 11.

Next, the drive section 20 performs the Vth correction during the period from the timing t2 to the timing t3 (Vth correction period P2). Specifically, the power line drive section 26 varies the power signal DS from the voltage Vini to the voltage Vccp at the timing t2 ((B) of FIG. 7). As a result, the drive transistor DRTr operates in a saturation region, and the current Ids flows from the drain to the source. The current Ids increases the source voltage Vs ((E) of FIG. 7). At this time, since the source voltage Vs is lower than the voltage Vcath of the cathode of the organic EL element OLED, the organic EL element OLED maintains a reverse bias state, and a current does not flow through the organic EL element OLED. The source voltage Vs increases in this way, which decreases the gate-source voltage Vgs. Therefore, the current Ids decreases. The current Ids converges toward "0" (zero) by the negative feedback operation. In other words, the gate-source voltage Vgs of the drive transistor DRTr converges to be equal to the threshold voltage Vth of the drive transistor DRTr (Vgs=Vth).

Next, the scan line drive section 23 varies the voltage of the scan signal WS from high level to low level at the timing t3 ((A) of FIG. 7). As a result, the write transistor WSTr is turned off. Then, the data line drive section 27 sets the signal Sig to the pixel voltage Vsig at the timing t4 ((C) of FIG. 7).

Then, the drive section 20 performs writing of the pixel voltage Vsig to the sub-pixels 11 and performs the μ correction during the period from timing t5 to timing t6 (writing and μ correction period P3). Specifically, the scan line drive section 23 varies the voltage of the scan signal WS from low level to high level at the timing t5 ((A) of FIG. 7). As a result, the write transistor WSTr is turned on, and the gate voltage Vg of the drive transistor DRTr increases from the voltage Vofs to the pixel voltage Vsig ((D) of FIG. 7). At this time, the gate-source voltage Vgs of the drive transistor DRTr becomes lager than the threshold voltage Vth (Vgs>Vth), and the current Ids flows from the drain to the source. Therefore, the source voltage Vs of the drive transistor DRTr increases ((E) of FIG. 7). With such negative feedback operation, influence of the element variation of the drive transistor DRTr is suppressed (μ (mobility) correction), and the gate-source voltage Vgs of the drive transistor DRTr is set to a voltage Vemi corresponding to the pixel voltage Vsig.

Then, the drive section 20 allows the sub-pixels 11 to emit light during a period after the timing t6 (emission period P4). Specifically, the scan line drive section 23 varies the voltage of the scan signal WS from high level to low level at the timing t6 ((A) of FIG. 7). As a result, the write transistor WSTr is turned off, and the gate of the drive transistor DRTr becomes floating. Accordingly, thereafter, an inter-terminal voltage of the capacitor Cs, namely, the gate-source voltage Vgs of the drive transistor DRTr is maintained. Further, the source voltage Vs of the drive transistor DRTr increases as the current Ids flows through the drive transistor DRTr ((E)

of FIG. 7), and the gate voltage Vg of the drive transistor DRTr accordingly increases ((D) of FIG. 7). Then, when the source voltage Vs of the drive transistor DRTr becomes larger than a sum (Vel+Vcath) of the threshold Vel of the organic EL element OLED and the voltage Vcath by such bootstrap operation, a current flows between the anode and the cathode of the organic EL element OLED, and the organic EL element OLED emits light. In other words, the source voltage Vs increases according to element variation of the organic EL element OLED, and the organic EL element OLED emits light.

After that, in the display unit 1, after a predetermined period (one frame period) is elapsed, transition from the emission period P4 to the initialization period P1 occurs. The drive section 20 performs driving so as to repeat the series of operation.

In this way, in the display unit 1, both the Vth correction and the μ correction are performed. Therefore, it is possible to suppress degradation of image quality caused by element variation of the drive transistor DRTr. In addition, in the display unit 1, the source voltage Vs increases according to the element variation of the organic EL element OLED during the emission period P4. Therefore, it is possible to suppress degradation of image quality caused by the element variation of the organic EL element OLED.

(Operation of Charge Pump Circuit 32 and Drive Circuit 34)

Next, detailed operation of the charge pump circuit 32 and the drive circuit 34 is described. The charge pump circuit 32 generates the signal St based on the four scan signals Ss that are supplied from the shift register 31. Then, the drive circuit 34 generates the power signal DS based on the voltage Vccp supplied from the voltage generation section 33 and the signal St supplied from the charge pump circuit 32.

Figure 8:
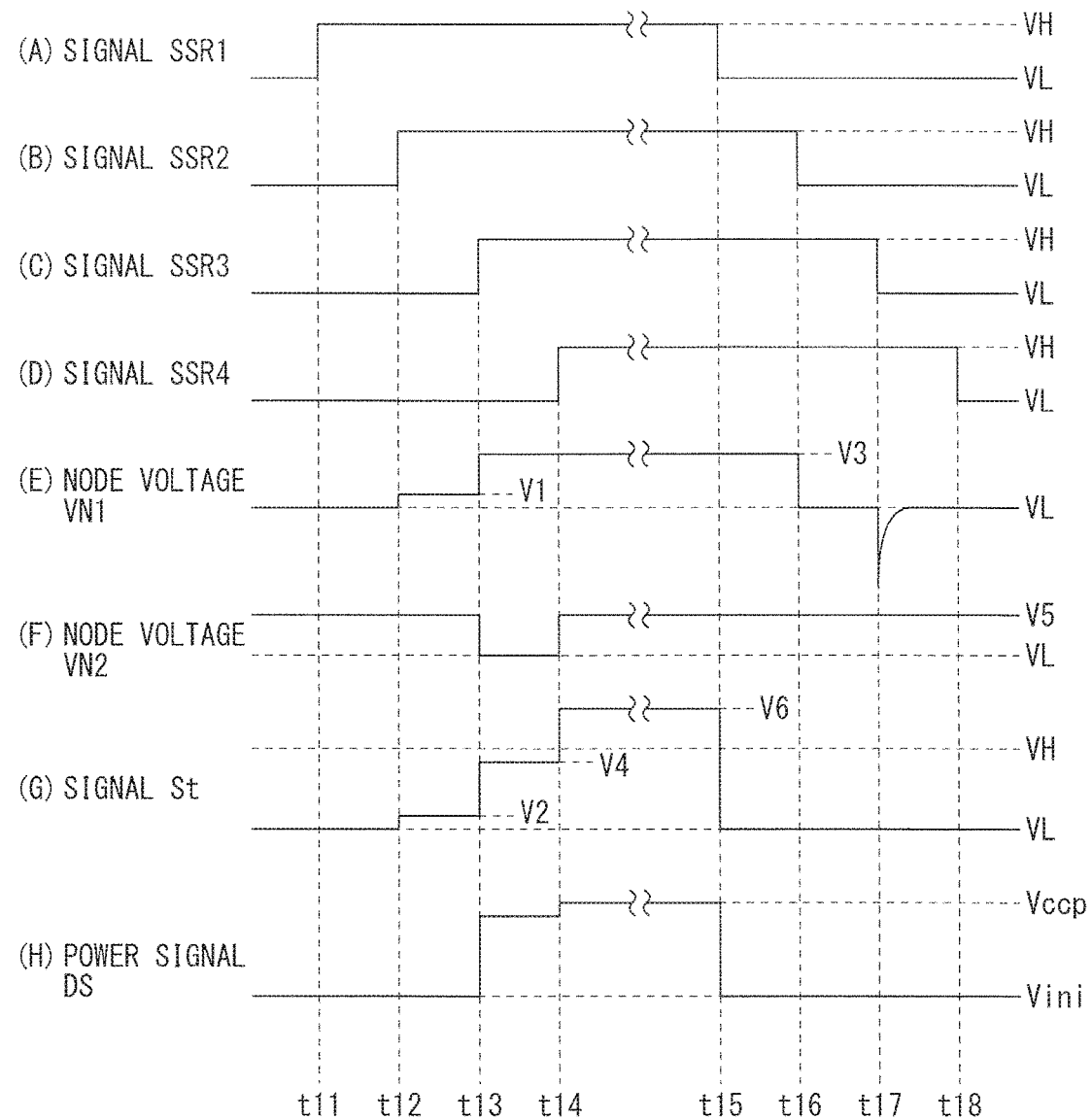
FIG. 8 is a timing waveform chart illustrating an operation example of the charge pump circuit and the drive circuit illustrated in FIG. 4.

FIG. 8 is a timing chart of operation of the charge pump circuit 32 and the drive circuit 34, where (A) to (D) illustrate waveforms of signals SSR1 to SSR4 that are applied to the input terminals SR1 to SR4 of the charge pump circuit 32, respectively, (E) illustrates a waveform of a node voltage VN1 at the source of the transistor Tr1, (F) illustrates a waveform of a node voltage VN2 at the source of the transistor Tr3, (G) illustrates a waveform of the signal St, and (H) illustrates a waveform of the power signal DS.

The shift register 31 supplies the signals SSR1 to SSR4 that are shifted in phase from one another, to the charge pump circuit 32. The charge pump circuit 32 generates the signal St whose amplitude is larger than the amplitude of each of the signals SSR1 to SSR4, based on the signals SSR1 to SSR4. The drive circuit 34 generates the power signal DS based on the signal St and the voltage Vccp. The detail thereof is described below.

First, the voltage of the signal SSR1 varies from the low level voltage VL to the high level voltage VH at timing t11 ((A) of FIG. 8). At this time, each of the gate voltage (the node voltage VN1) and the source voltage (the signal St) of the transistor Tr2 is the voltage VL ((E) and (G) of FIG. 8). In other words, the gate-source voltage Vgs of the transistor Tr2 is 0 V, and the transistor Tr2 is in off state.

Then, the voltage of the signal SSR2 varies from the low level voltage VL to the high level voltage VH at timing t12 ((B) of FIG. 8). As a result, the transistor Tr1 is transiently turned on, and the source voltage (the node voltage VN1) of the transistor Tr1 varies to the voltage V1 ((E) of FIG. 8). The voltage V1 is represented by the following expression.

$$V1 = VG1 - Vth1 \tag{1}$$

Here, Vth1 denotes the threshold voltage of the transistor Tr1. Specifically, the voltage V1 is a voltage lower than the gate voltage (the voltage VG1) of the transistor Tr1 by the threshold voltage Vth1 of the transistor Tr1. In other words, the gate-source voltage Vgs of the transistor Tr1 becomes equivalent to the threshold voltage Vth1 of the transistor Tr1.

Further, in response to the variation of the node voltage VN1, the transistor Tr2 is transiently turned on, and the source voltage (the signal St) of the transistor Tr2 varies to the voltage V2 ((G) of FIG. 8). The voltage V2 is represented by the following expression.

$$\begin{aligned} V2 &= V1 - Vth2 \\ &= VG1 - Vth1 - Vth2 \end{aligned} \tag{2}$$

Here, Vth2 denotes the threshold voltage of the transistor Tr2. Specifically, the voltage V2 is a voltage lower than the gate voltage (the voltage V1) of the transistor Tr2 by the threshold voltage Vth2 of the transistor Tr2. In other words, the gate-source voltage Vgs of the transistor Tr2 becomes equivalent to the threshold voltage Vth2 of the transistor Tr2.

In this way, since the voltage level of the signal St is low, the transistors Tr4 and Tr5 each maintain the off state in the drive circuit 34. Therefore, the voltage of the power signal DS is maintained ((H) of FIG. 8).

Next, at timing t13, the voltage of the signal SSR3 varies from the low level voltage VL to the high level voltage VH ((C) of FIG. 8). As a result, the voltage variation is transmitted to the source of the transistor Tr1 through the capacitor C1, and the source voltage (the node voltage VN1) of the transistor Tr1 accordingly varies to a voltage V3 ((E) of FIG. 8). The voltage V3 is represented by the following expression.

$$\begin{aligned} V3 &= V1 + (VH - VL) \times \text{Gain1} \\ &= VG1 - Vth1 + (VH - VL) \times \text{Gain1} \end{aligned} \tag{3}$$

Here, Gain1 denotes a gain representing a ratio between the voltage variation at the one end of the capacitor C1 and the voltage variation at the other end of the capacitor C1, and the gain is defined by the capacitance value of the capacitor C1, parasitic capacitance of the transistors Tr1 and Tr2, and the like. In this way, when the source voltage of the transistor Tr1 increases, the gate-source voltage Vgs of the transistor Tr1 becomes lower than the threshold voltage Vth1 of the transistor Tr1, and the transistor Tr1 is turned off.

Further, in response to the variation of the node voltage VN1, the transistor Tr2 is transiently turned on, and the source voltage (the signal St) of the transistor Tr2 varies to a voltage V4 ((G) of FIG. 8). The voltage V4 is represented by the following expression.

$$\begin{aligned} V4 &= V3 - Vth2 \\ &= VG1 - Vth1 - Vth2 + (VH - VL) \times \text{Gain1} \end{aligned} \tag{4}$$

Specifically, the voltage V4 is a voltage lower than the gate voltage (the voltage V3) of the transistor Tr2 by the threshold voltage Vth2 of the transistor Tr2. In other words, the gate-source voltage Vgs of the transistor Tr2 becomes equivalent to the threshold voltage Vth2 of the transistor Tr2.

In this way, when the voltage of the signal St is increased, the power signal Ds rises ((H) of FIG. 8). Specifically, in the drive circuit 34, the transistor Tr4 is turned on and the transistor Tr5 is turned off, and the power signal DS rises toward the voltage Vccp. In this example, the voltage of the power signal DS is slightly lower than the voltage Vccp because the on resistance of the transistor Tr4 is not sufficiently low.

Moreover, in response to the variation of the signal SSR3, the transistor Tr3 is turned on and the source voltage (the node voltage VN2) of the transistor Tr3 varies to the voltage VL in the charge pump circuit 32 ((F) of FIG. 8).

Next, at timing t14, the voltage of the signal SSR4 varies from the low level voltage VL to the high level voltage VH ((D) of FIG. 8). As a result, the transistor Tr3 is transiently turned on, and the source voltage (the node voltage VN2) of the transistor Tr3 varies to a voltage V5 ((F) of FIG. 8). The voltage V5 is represented by the following expression.

$$V5 = VH - Vth3 \quad (5)$$

Here, Vth3 denotes the threshold voltage of the transistor Tr3. Specifically, the voltage V5 is a voltage lower than the gate voltage (the voltage VH) of the transistor Tr3 by the threshold voltage Vth3 of the transistor Tr3. In other words, the gate-source voltage Vgs of the transistor Tr3 becomes equivalent to the threshold voltage Vth3 of the transistor Tr3.

Further, in response to the variation of the node voltage VN2, the voltage variation is transmitted to the source of the transistor Tr2 through the capacitor C2, and the source voltage (the signal St) of the transistor Tr2 varies to a voltage V6 that is higher than the voltage VH ((G) of FIG. 8). The voltage V6 is represented by the following expression.

$$V6 = V4 + (V5 - VL) \times \text{Gain2} \quad (6)$$
$$= VG1 - Vth1 - Vth2 + (VH - VL) \times \text{Gain1} +$$
$$(VH - VL - Vth3) \times \text{Gain2}$$

Here, Gain2 denotes a gain representing a ratio between the voltage variation at the one end of the capacitor C2 and the voltage variation at the other end of the capacitor C2, and the gain is defined by the capacitance value of the capacitor C2, the parasitic capacitance of the transistors Tr2, Tr4, and Tr5, and the like. In this example, the gain Gain1 and Gain2 are set so that the voltage V6 becomes higher than the voltage VH. In this way, when the source voltage of the transistor Tr2 increases, the gate-source voltage Vgs of the transistor Tr2 becomes lower than the threshold voltage Vth2 of the transistor Tr2, and the transistor Tr2 is turned off.

In this way, when the signal St becomes the voltage V6 higher than the voltage VH, the on resistance of the transistor Tr4 of the drive circuit 34 is sufficiently low, and the power signal DS becomes the voltage Vccp ((H) of FIG. 8).

Subsequently, at timing t15, the voltage of the signal SSR1 varies from the high level voltage VH to the low level voltage VL ((A) of FIG. 8). As a result, the transistor Tr2 is tuned on, and the source voltage (the signal St) of the transistor Tr2 varies to the voltage VL ((G) of FIG. 8).

Further, the power signal DS falls in response to the variation of the voltage of the signal St ((H) of FIG. 8). Specifically, in the drive circuit 34, the transistor Tr4 is turned off and the transistor Tr5 is transiently turned on, and the power signal DS varies to the voltage Vini. Here, the voltage Vini is represented by the following expression.

$$Vini = VL + Vth5 \quad (7)$$

Here, Vth5 denotes the threshold voltage of the transistor Tr5. Specifically, the voltage Vini is a voltage higher than the source voltage (the voltage VL) of the transistor Tr5 by the threshold voltage Vth5 of the transistor Tr5. In other words, the gate-source voltage Vgs of the transistor Tr5 becomes equivalent to the threshold voltage Vth5 of the transistor Tr5.

Next, at timing t16, the voltage of the signal SSR2 varies from the high level voltage VH to the low level voltage VL ((B) of FIG. 8). As a result, the transistor Tr1 is turned on, and the source voltage (the node voltage VN1) of the transistor Tr1 varies to the voltage VL ((E) of FIG. 8).

Next, at timing t17, the voltage of the signal SSR3 varies from the high level voltage VH to the low level voltage VL ((C) of FIG. 8). As a result, the voltage variation is transmitted to the source (the node voltage VN1) of the transistor Tr1 through the capacitor C1, and therefore the node voltage VN1 transiently varies from the voltage VL ((E) of FIG. 8). However, since the transistor Tr1 is in the on state, the node voltage VN1 converges to the voltage VL again.

In addition, when the voltage of the signal SSR3 varies to the low level voltage VL, the transistor Tr3 is turned off, and the source of the transistor Tr3 becomes high impedance. As a result, the source voltage (the node voltage VN2) of the transistor Tr3 is maintained ((F) of FIG. 8).

Subsequently, at timing t18, the voltage of the signal SSR4 varies from the high level voltage VH to the low level voltage VL ((D) of FIG. 8). At this time, since the transistor Tr3 maintains the off state, the source voltage (the node voltage VN2) of the transistor Tr3 is maintained ((F) of FIG. 8), and the source voltage (the signal St) of the transistor Tr2 is also maintained ((G) of FIG. 8).

The charge pump circuit 32 and the drive circuit 34 repeat the above operation to continuously generate the power signal DS.

In this way, in the display unit 1, the charge pump circuit 32 is provided. Therefore, it is possible to increase the voltage of the signal St to the voltage V6 that is higher than the high level voltage VH, and thus it is possible to supply the signal St having large amplitude to the drive circuit 34. As a result, when the drive circuit 34 outputs the voltage Vccp as the power signal DS, it is possible to sufficiently decrease the on resistance of the transistor Tr4 even if the voltage Vccp is high. In other words, it is possible for the drive circuit 34 to generate the power signal DS having large amplitude.

Moreover, in this way, the charge pump 32 and the drive circuit 34 generate the power signal DS having large amplitude, based on the scan signal Ss having small amplitude. Therefore, for example, it may be possible to decrease the power voltage of the shift register 31 and the like, and to reduce consumed power of the display unit 1.

Moreover, in the charge pump circuit 32, the two capacitors C1 and C2 are provided. Therefore, it is possible to generate the signal St having larger amplitude. Specifically, in the charge pump circuit 32, the voltage of the signal St is increased with use of the capacitor C1 at the timing t13, and the voltage of the signal St is increased again with use of the capacitor C2 at the timing 14. Therefore, as compared with a case where the voltage is increased once, it is possible to increase the voltage of the signal St to higher level, and to generate the signal St having large amplitude.

Moreover, in the charge pump circuit 32, the transistor Tr3 is provided, and the transistor Tr3 is turned off at the timing t17. Therefore, it is possible to prevent the signal St from varying due to falling of the signal SSR4 at the timing t18. As a result, the disturbance of the waveform of the power signal DS is suppressed, which makes it possible to reduce possibility of degradation of image quality of the display unit 1.

(Effects)

As described above, in the present embodiment, the charge pump circuit is provided. Therefore, it is possible to generate the power signal DS having large amplitude.

In the present embodiment, the two capacitors are provided in the charge pump circuit. Therefore, it is possible to generate the signal St having large amplitude.

In the present embodiment, the transistor Tr3 is provided in the charge pump circuit. Therefore, it is possible to suppress disturbance of the waveform of the power signal, and to reduce possibility of degradation of the image quality of the display unit.

(Modification 1)

Figure 9:
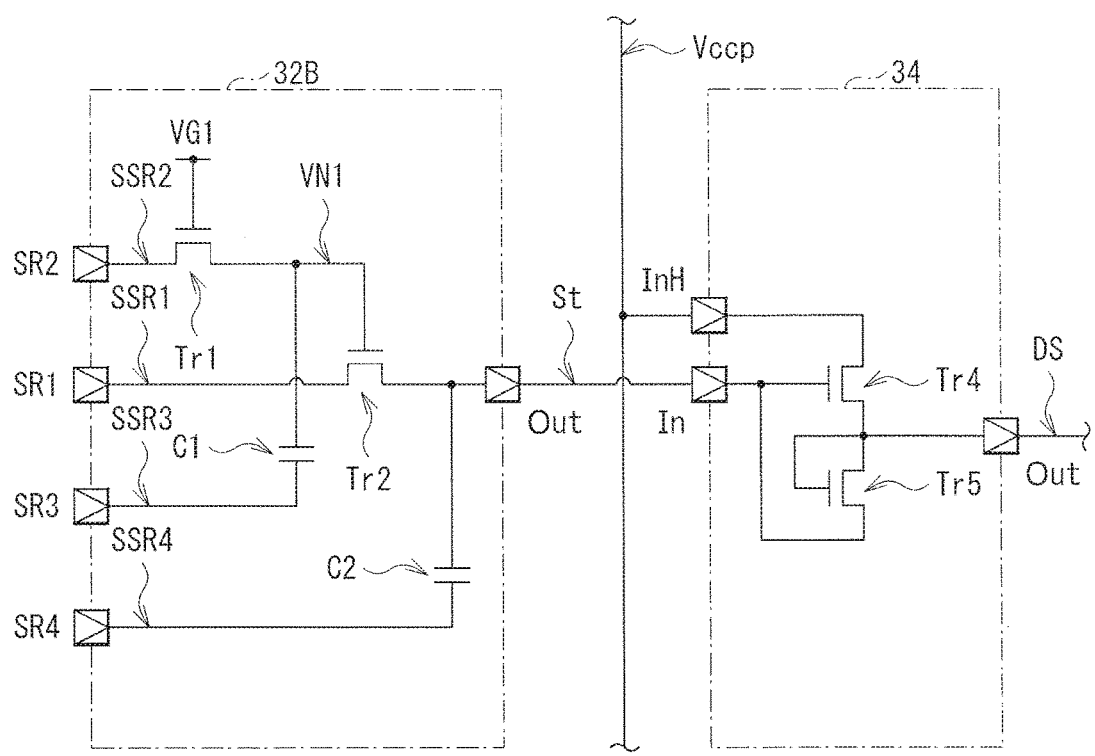
FIG. 9 is a circuit diagram illustrating a configuration example of a charge pump circuit according to a modification.

In the above-described embodiment, the transistor Tr3 is provided in the charge pump circuit 32. However, the configuration is not limited thereto, and alternatively, for example, as illustrated in FIG. 9, the transistor Tr3 may be omitted. In a charge pump circuit 32B, the other end of the capacitor C1 is connected to the input terminal SR3. In addition, the other end of the capacitor C2 is connected to the input terminal SR4. In this case, the signal St may transiently vary and the power signal DS may also transiently vary in response to the transition of the signal SSR4 input to the input terminal SR4. However, in a case where such variation is tolerated, such configuration may be applied.

(Modification 2)

In the above-described embodiment, the charge pump circuit 32 generates the signal St based on the four scan signals Ss. However, the configuration is not limited thereto, and alternatively, the charge pump circuit may generate the signal St based on three or lee scan signals Ss or five or more scan signals Ss. A case where the charge pump circuit generates the signal St based on two scan signals Ss is described in detail below as an example.

Figure 10:
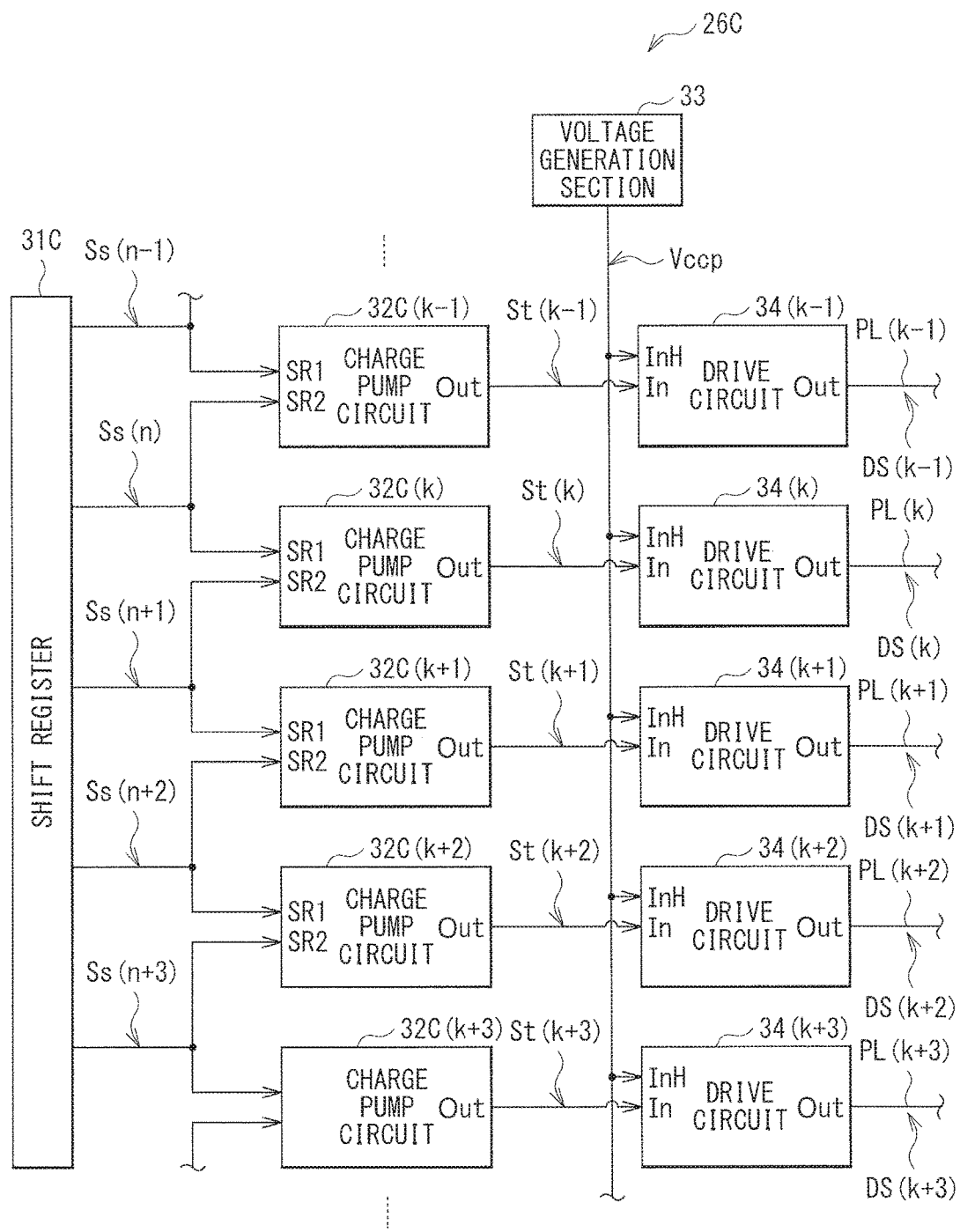
FIG. 10 is a block diagram illustrating a configuration example of a power line drive section according to another modification.

FIG. 10 illustrates a configuration example of a power line drive section 26C according to the present modification. The power line drive section 26C includes a shift register 31C and a plurality of charge pump circuits 32C. The shift register 31C has a function similar to that of the shift register 31 according to the above-described embodiment. Each of the charge pumps 32C generates the signal St that has amplitude larger than amplitude of each of two scan signals Ss, based on the two scan signals Ss. Specifically, for example, the charge pump circuit 32C(k) generates the signal St(k), based on the two scan signals Ss(n) and Ss(n+1). Likewise, the charge pump circuit 32C(k+1) generates the signal Ss(k+1), based on the two scan signals Ss(n+1) and Ss(n+2). Each of the charge pump circuits 32C has input terminals SR1 and SR2 to which the two scan signals Ss are input, and an output terminal Out that outputs the signal St. For example, the scan signal Ss(n) is input to the input terminal SR1 of the charge pump circuit 32C(k), and the scan signal Ss(n+1) is input to the input terminal SR2.

Figure 11:
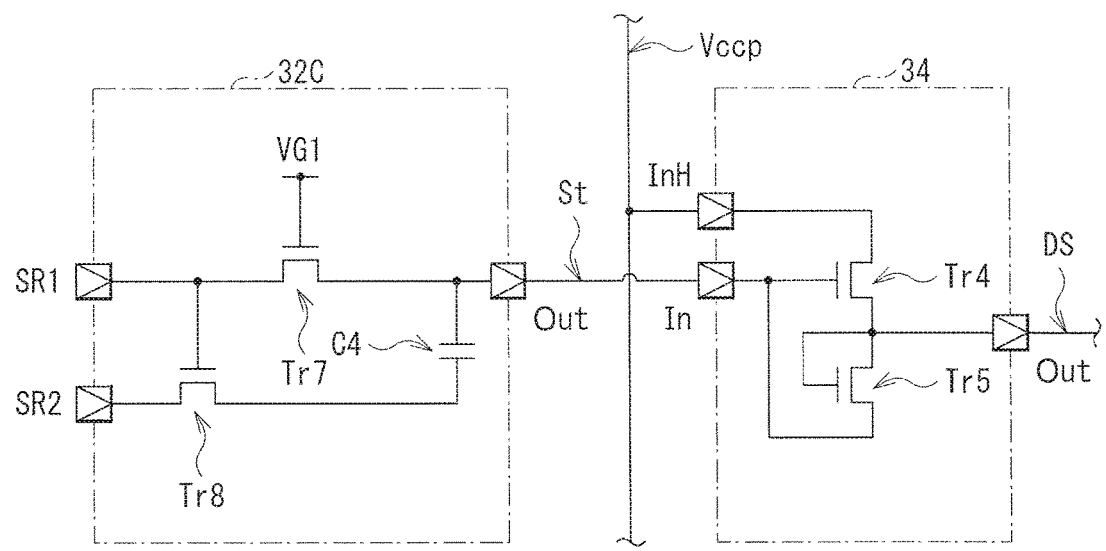
FIG. 11 is a circuit diagram illustrating a configuration example of a charge pump circuit illustrated in FIG. 10.

FIG. 11 illustrates a configuration example of the charge pump circuit 32C. The charge pump circuit 32C includes transistors Tr7 and Tr8 and a capacitor C4. For example, each of the transistors Tr7 and Tr8 may be configured of an N-channel MOSTFT. A gate of the transistor Tr7 is supplied with a DC voltage VG1, a drain thereof is connected to the input terminal SR1, and a source thereof is connected to one end of the capacitor C4 and the output terminal Out of the charge pump circuit 32C. A gate of the transistor Tr8 is connected to the input terminal SR1, a drain thereof is connected to the input terminal SR2, and a source thereof is connected to the other end of the capacitor C4. The one end of the capacitor C4 is connected to the source of the transistor Tr7 and the output terminal Out of the charge pump circuit 32C, and the other end thereof is connected to the source of the transistor Tr8.

The charge pump circuit 32C according to the present modification also supplies the signal St having large amplitude, similarly to the charge pump circuit 32 according to the above-described embodiment.

(Modification 3)

In the above-described embodiment, the power line drive section 26 is configured using the charge pump circuit 32. However, the configuration is not limited thereto, and alternatively or in addition thereto, the scan line drive section 23 may be configured using the charge pump circuit 32.

(Modification 4)

In the above-described embodiment, the technology is applied to the display unit using the organic EL element. However, the application is not limited thereto, and alternatively, for example, the technology may be applied to a display unit using a liquid crystal display element. Specifically, for example, the technology may be applied to a circuit selecting pixels to which the pixel voltage is written (corresponding to the scan line drive section 23 in the above-described embodiment).

2. Application Examples

Next, application examples of the display units described in the above-described embodiment and the modifications are described.

Figure 12:
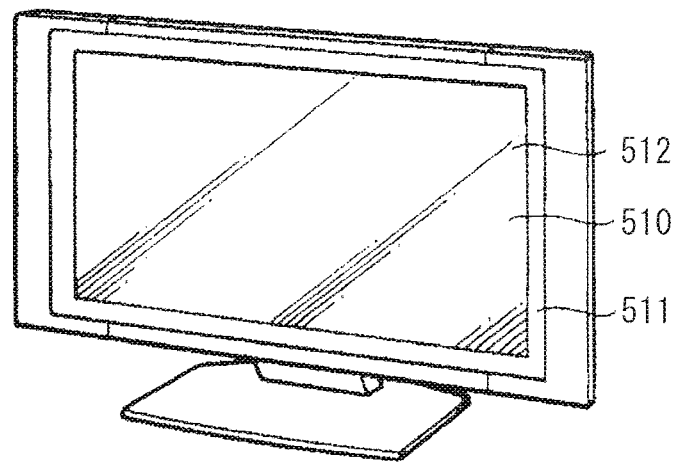
FIG. 12 is a perspective view illustrating an appearance configuration of a television apparatus to which the display unit according to the embodiment is applied.

FIG. 12 illustrates an appearance of a television apparatus to which the display unit according to any of the above-described embodiment and the like is applied. The television apparatus may have, for example, a picture display screen section 510 that may include a front panel 511 and a filter glass 512, and the picture display screen section 510 is configured of the display unit according to any of the above-described embodiment and the like.

The display unit according to any of the above-described embodiment and the like is applicable to electronic apparatuses in various fields, for example, a digital camera, a notebook personal computer, a mobile terminal device such as a mobile phone, a portable game machine, and a video camera, in addition to such a television apparatus. In other words, the display unit according to any of the above-described embodiment and the like is applicable to electronic apparatuses in various fields that display a picture.

Hereinbefore, although the technology has been described with referring to the embodiment, the modifications, and the application examples to the electronic units, the technology is not limited to the embodiment and the like, and various modifications may be made.

Figure 13:
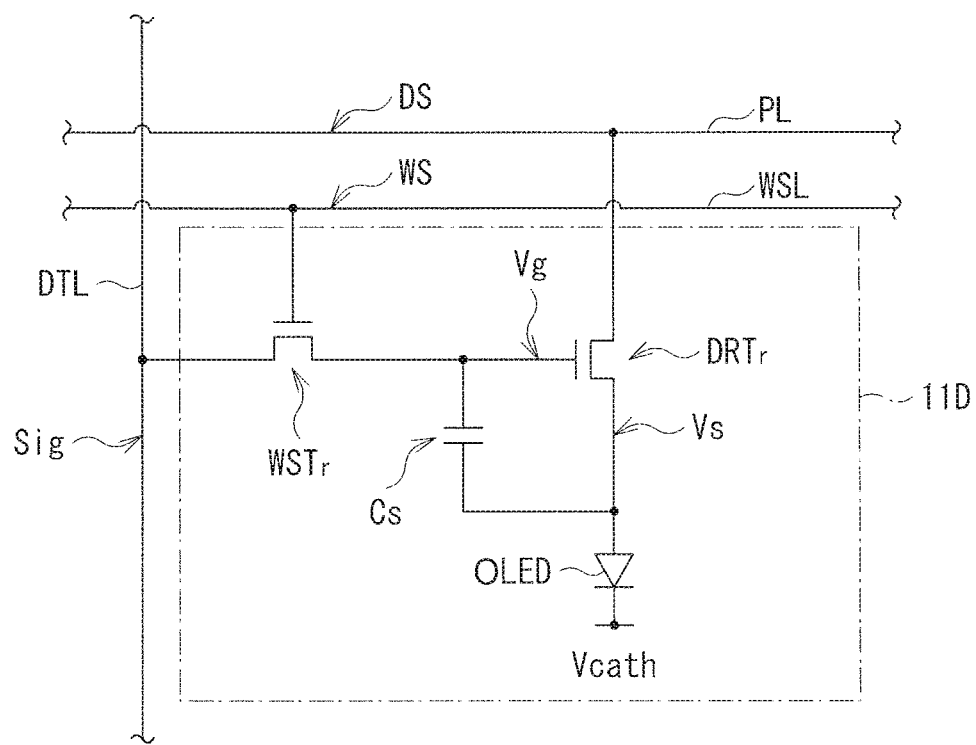
FIG. 13 is a circuit diagram illustrating a configuration example of a sub-pixel according to another modification.

For example, in the above-described embodiment, the capacitor Csub is provided in the sub-pixel 11. However, the configuration is not limited thereto, and alternatively, for example, the capacitor Csub may not be provided in a sub-pixel 11C illustrated in FIG. 13. Specifically, in this example, the sub-pixel 11C has a so-called "2Tr1C" configuration that is configured of two transistors (a write transistor WSTr and a drive transistor DRTr) and one capacitor Cs.

Note that the technology may be configured as follows.

(1) A display unit including:
a first transistor including a gate, a drain, and a source;
a first capacitor including a first terminal and a second terminal, the second terminal being connected to one of the drain and the source of the first transistor; and
a unit pixel configured to be driven based on a voltage of the second terminal.

(2) The display unit according to (1), further including:
a second transistor including a drain and a source; and
a second capacitor including a third terminal and a fourth terminal, the fourth terminal being connected to the gate of the first transistor and one of the drain and the source of the second transistor.

(3) The display unit according to (2), further including
a third transistor including a drain, a source, and a gate, the gate being connected to the third terminal.

(4) The display unit according to (3), wherein
a first pulse signal is applied to a terminal that is different from a terminal connected to the second terminal, out of the drain and the source of the first transistor,
a second pulse signal is applied to a terminal that is different from a terminal connected to the fourth terminal, out of the drain and the source of the second transistor,
a third pulse signal is applied to the third terminal, and
a fourth pulse signal is applied to a terminal that is different from a terminal connected to the first terminal, out of the drain and the source of the third transistor.

(5) The display unit according to (4), wherein
the second pulse signal performs transition of first polarity after the first pulse signal performs transition of the first polarity,
the third pulse signal performs transition of the first polarity after the second pulse signal performs the transition of the first polarity, and
the fourth pulse signal performs transition of the first polarity after the third pulse signal performs the transition of the first polarity.

(6) The display unit according to (4), further including
a shift register configured to generate the first pulse signal, the second pulse signal, the third pulse signal, and the fourth pulse signal.

(7) The display unit according to any one of (1) to (6), further including:
a switch configured to perform ON-OFF control between a fifth terminal and a sixth terminal, based on the voltage of the second terminal, the fifth terminal being supplied with a DC signal, and the sixth terminal being connected to the unit pixel; and
a non-linear element interposed between the second terminal and the sixth terminal.

(8) The display unit according to (7), wherein the non-linear element is a fourth transistor including a source that is connected to the second terminal, and a drain and a gate that are connected to the sixth terminal.

(9) The display unit according to any one of (1) to (8), wherein
the unit pixel includes a display element and a drive transistor that is configured to supply a drive current to the display element, and
the switch is configured to supply the drive current to the drive transistor.

(10) A display driving unit including:
a first transistor including a gate, a drain, and a source; and
a first capacitor including a first terminal and a second terminal, the second terminal being connected to one of the drain and the source of the first transistor.

(11) A driving method including:
applying a pulse signal to one of a drain and a source of a first transistor;
applying other pulse signal to a first terminal of a first capacitor, the first capacitor including the first terminal and a second terminal, the second terminal being connected to a terminal that is different from a terminal supplied with the pulse signal, out of the drain and the source of the first transistor; and
driving a unit pixel based on a voltage of the second terminal.

(12) An electronic apparatus provided with a display unit and a control section configured to perform operation control on the display unit, the display unit including:
a first transistor including a gate, a drain, and a source;
a first capacitor including a first terminal and a second terminal, the second terminal being connected to one of the drain and the source of the first transistor; and
a unit pixel configured to be driven based on a voltage of the second terminal.

This application is based upon and claims the benefit of priority of the Japanese Patent Application No. 2013-4542 filed in the Japan Patent Office on Jan. 15, 2013, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A display unit comprising:
a first transistor including a gate, a drain, and a source;
a first capacitor including a first terminal and a second terminal, the second terminal being connected to one of the drain or the source of the first transistor;
a unit pixel configured to be driven based on a voltage of the second terminal;
a second transistor including a drain and a source;
a second capacitor including a third terminal and a fourth terminal, the fourth terminal being connected to the gate of the first transistor and one of the drain or the source of the second transistor; and
a third transistor including a drain, a source, and a gate, the gate being connected to the third terminal.

2. The display unit according to claim 1, wherein
a first pulse signal is applied to that of the source or the drain of the first transistor that is not connected to the second terminal,
a second pulse signal is applied to that of the drain or the source of the second transistor that is not connected to the fourth terminal,
a third pulse signal is applied to the third terminal, and
a fourth pulse signal is applied to a terminal that is different from a terminal connected to the first terminal, out of the drain and the source of the third transistor.

3. The display unit according to claim 2, wherein
the second pulse signal performs transition of first polarity after the first pulse signal performs transition of the first polarity, the third pulse signal performs transition of the first polarity after the second pulse signal performs the transition of the first polarity, and the fourth pulse signal performs transition of the first polarity after the third pulse signal performs the transition of the first polarity.

4. The display unit according to claim 2, further comprising a shift register configured to generate the first pulse signal, the second pulse signal, the third pulse signal, and the fourth pulse signal.

5. A display unit comprising:

a first transistor including a gate, a drain, and a source;

a first capacitor including a first terminal and a second terminal, the second terminal being connected to one of the drain or the source of the first transistor;

a unit pixel configured to be driven based on a voltage of the second terminal;

a switch configured to perform ON-OFF control between a fifth terminal and a sixth terminal, based on the voltage of the second terminal, the fifth terminal being supplied with a DC signal, and the sixth terminal being connected to the unit pixel; and a non-linear element interposed between the second terminal and the sixth terminal.

6. The display unit according to claim 5, wherein the non-linear element is a fourth transistor including a source that is connected to the second terminal, and a drain and a gate that are connected to the sixth terminal.

7. The display unit according to claim 5, wherein the unit pixel includes a display element and a drive transistor that is configured to supply a drive current to the display element, and the switch is configured to supply the drive current to the drive transistor.

8. A display driving unit comprising:

a first transistor including a gate, a drain, and a source; and a first capacitor including a first terminal and a second terminal, the second terminal being connected to one of the drain or the source of the first transistor, to drive a unit pixel based on a voltage of the second terminal;

a second transistor including a drain and a source;

a second capacitor including a third terminal and a fourth terminal, the fourth terminal being connected to the gate of the first transistor and one of the drain or the source of the second transistor; and a third transistor including a drain, a source, and a gate, the gate being connected to the third terminal.

9. A driving method comprising:

applying a first pulse signal to one of a drain or a source of a first transistor;

applying a second pulse signal to a first terminal of a first capacitor, the first capacitor including the first terminal and a second terminal, the second terminal being connected to that of the drain or the source of the first transistor to which the first pulse signal is not applied; and driving a unit pixel based on a voltage of the second terminal.

10. An electronic apparatus comprising a display unit according to claim 3, and a control section configured to perform operation control on the display unit, the display unit.

11. The electronic apparatus according to claim 10, wherein a first pulse signal is applied to that of the source or the drain of the first transistor that is not connected to the second terminal, a second pulse signal is applied to that of the drain or the source of the second transistor that is not connected to the fourth terminal, a third pulse signal is applied to the third terminal, and a fourth pulse signal is applied to a terminal that is different from a terminal connected to the first terminal, out of the drain and the source of the third transistor.

12. The electronic apparatus according to claim 11, wherein the second pulse signal performs transition of first polarity after the first pulse signal performs transition of the first polarity, the third pulse signal performs transition of the first polarity after the second pulse signal performs the transition of the first polarity, and the fourth pulse signal performs transition of the first polarity after the third pulse signal performs the transition of the first polarity.

13. The electronic apparatus according to claim 11, further comprising a shift register configured to generate the first pulse signal, the second pulse signal, the third pulse signal, and the fourth pulse signal.

* * * * *